United States Patent
Lin

(10) Patent No.: US 7,088,116 B1
(45) Date of Patent: Aug. 8, 2006

(54) OPTOELECTRONIC PROBE

(75) Inventor: Haian Lin, 5019 Preakness Pl., Bethlehem, PA (US) 18020

(73) Assignee: Haian Lin, Bethlehem, PA (US)

( * ) Notice: Subject to any disclaimer, the term of this patent is extended or adjusted under 35 U.S.C. 154(b) by 0 days.

(21) Appl. No.: 11/054,564

(22) Filed: Feb. 9, 2005

(51) Int. Cl.
  *G01R 27/08* (2006.01)
  *G01R 31/26* (2006.01)
  *H01L 21/66* (2006.01)

(52) U.S. Cl. ............ 324/693; 324/752; 204/450; 438/10; 438/17

(58) Field of Classification Search ............ 324/693, 324/425, 438, 439, 94, 96, 692
See application file for complete search history.

(56) References Cited

U.S. PATENT DOCUMENTS

| | | | |
|---|---|---|---|
| 5,855,753 A | 1/1999 | Trau | |
| 6,033,547 A | 3/2000 | Trau | |
| 6,169,394 B1* | 1/2001 | Frazier et al. ............ 324/71.4 | |
| 6,251,691 B1 | 6/2001 | Seul | |
| 6,387,707 B1 | 5/2002 | Seul | |
| 6,468,811 B1 | 10/2002 | Seul | |
| 6,514,771 B1 | 2/2003 | Seul | |
| 6,605,453 B1 | 8/2003 | Ozkan | |
| 6,706,163 B1 | 3/2004 | Seul | |
| 6,797,524 B1 | 9/2004 | Seul | |
| 2003/0142409 A1* | 7/2003 | Ohtsu et al. ............ 359/619 |
| 2004/0136875 A1* | 7/2004 | Seul et al. ............ 422/99 |
| 2004/0152067 A1* | 8/2004 | Wang et al. ............ 435/4 |

* cited by examiner

*Primary Examiner*—Anjan Deb

(57) ABSTRACT

The present invention, referred to as optoelectronic probe, concerns a novel apparatus and method for characterization and micromanipulation of particles or biomolecules in an electrolyte solution. Electric fields, which include both time constant and time-varying components, are applied to a thin insulating layer covered, lightly doped semiconductor material. Illumination injects carriers into the insulator/semiconductor interface to compensate the leaking minority carrier current and maintain an inversion layer, which works as an electrode to control the particle movements. A particle array, or even a single cell, can be assembled in, or moved along with the inversion layer electrode, which is induced by illumination. Furthermore, an impedance analyzer is utilized to characterize the trapped particles, or single cell. The present invention has numerous uses, such as bio-chemical analysis systems, and nanosize structures assembly for electronic or optical devices.

17 Claims, 5 Drawing Sheets

OPTOELECTRONIC PROBE

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISK APPENDIX

Not Applicable

BACKGROUND OF THE INVENTION

1. Field of Invention

The present invention is directed generally to methods and apparatus based on optoelectronic effect, electro/dielectro-phoresis, and impedance spectroscopy, in order to trap, move, deform and characterize particles, such as cells, molecules, any type of colloids, any of inorganic and bio-organic substances, beads, as well as pucks and like small things. "Optoelectronic Probe" refers to the invention described herein.

2. Background of the Invention

I. Optical Tweezers

The manipulation of micro- or nano-size particles is considered as the key for the new generation of photonic, optoelectronic, and electronic devices, as well as biochemical analysis systems. Optical tweezers is one of the most unique invention in this area and was first successfully demonstrated by A. Ashkin et al. in pioneering works in 1985. (Ashkin, A.; Dziedzic, J. M., "Observation of Radiation-Pressure Trapping of Particles by Alternating Light Beams", Phys. Rev. Lett. 54, pp 1245–1248 (1985)) The technique of optical tweezers is based on the forces of radiation pressure. These are dipole- or gradient-forces arising from the momentum of the light itself. To make these forces large enough to accelerate, decelerate, deflect, guide, and even stably trap small particles, one has to use continuous wave coherent laser beams to achieve the high intensities and high intensity gradients. Combined with other techniques, optical tweezers can also be a unique tool to characterize the trapped particle. For example, laser fluorescence techniques give increased opportunities to a proper identification of different types of biological objects or labeling.

Although the Optical Tweezers is a very powerful tool, it also has its limitations, such as: 1) that the trapping zone is rather small (on the order of the light wavelength); and 2) focusing the beam leads to very high intensities that can endanger the integrity of biological objects.

II. Electrophoresis/Dielectrophoresis Based Arts

When it is exposed to an electrical field, a charged particle will experience a force and the resulting motion is called as electrophoresis (EP). A neutral particle can also be polarized under electrical field. If a nonuniform direct current (DC) or alternating current (AC) field exists, the polarized particle will move towards or away from regions of high electric-field intensity. This motion is a result of interaction between the field and dipole moment induced in a particle and is called dielectrophoresis (DEP).

The dielectrophoretic force on the particle varies with the frequency of the applied electric field. At the low frequency, the polarity of the dielectrophoretic force on the particle depends on the conductivity difference between the particles and electrolyte. On the other hand, at the high frequency the polarity of the dielectrophoretic force on the particle depends on the permittivity difference between the particles and electrolyte. If the particle is more conductive than the electrolyte around it, the dipole aligns with the field and the force acts up the field gradient towards the region of highest electric field. This effect is called positive dielectrophoresis (PDEP). If the particle is less polarisable than the electrolyte, the dipole aligns against the field and the particle is repelled from regions of high electric field (Hughes, "AC Electrokinetics: Applications for Nanotechnology", Nanotechnology, 11, pages 124–132, (2000)). This effect is called negative dielectrophoresis (NDEP).

Recently, both EP and DEP have captured much interest because they are effective ways to trap, move, deform and separate particles ranging from colloidals to DNA strands and biological cells (Huang, Y; Ewalt, K. L; et al; "Electric Manipulation of Bioparticles and Macromolecules on Microfabricated electrodes", Anal Chem, 73, pp. 1549–1559, (2001)). In most cases, embedded electrodes were carefully designed and fabricated by semiconductor processing techniques on substrates, such as silicon, glass or plastics.

The field-induced assembly method is a unique application of Electrophoresis/Dielectrophoresis technology. The precise assembly of two- and three-dimensional colloidal on Conductive ITO electrode surfaces may be induced by an AC or DC electrical field that is normal to the electrode surfaces (U.S. Pat. Nos. 5,855,753, and 6,033,547). This technology was extended on silicon electrode, on which the formation, placement, and rearrangement of planar colloidal arrays can be effected by an external illumination pattern due to the photo-assisted impedance modulation. According to Seul et al, it is necessary to apply an AC electrical field to penetrate the thin oxide existing on the silicon surface (U.S. Pat. Nos. 6,251,691, 6,387,707, 6,468,811, 6,514,771, 6,706,163, and 6,797,524). A optoelectronic tweezers has also been demonstrated by Chiou et al. (Chiou, P. Y; Chang, Z; et al; Proc. IEEE/LEOS International Conference Optical MEMS, pp. 8–9, (2003)) The impedance of an amorphous silicon layer, covered by a silicon nitride layer, is modulated by a laser beam. The particles inside the electrolyte are polarized by a non-uniform AC field and pushed away from the illuminated region by the negative dielectrophoresis force. Those prior arts show superperformances on particle manipulation, but still have their limitations, such as: 1) inability to characterize particle electrically; 2) lack of advantages related to DC electric field; and 3) that the depletion layer at the semiconductor surface and the polarities switching with the AC signal make it very hard to precisely control the electric field applied on the particles.

Ozkan et al have developed an optical addressing scheme to localize polymer beads on an unpatterned silicon surface based on a DC electric field (Ozkan et al, "Heterogeneous Integration through Electrokinetic Migration", IEEE Engineering in Medicine and Biology, Nov/Dec, pp144 (2001), or Ozkan et al, "Optical Addressing of Polymer Beads in Microdevices", Sensor and Materials, Vol 14, No 4, pp189–197, (2002)). This approach utilizes an optical microbeam that is directed on the substrate to create an active 'virtual' electrode (U.S. Pat. No. 6,605,453). The localized charge is defined by the characteristics of the silicon-electrolyte interface in the electrochemical system and serves to attract oppositely charged objects within the solution. Without a layer of oxide inserted between the silicon and electrolyte, DC voltage was able to be used to manipulate the particles. This technique also has its limitations, such as: 1) undesired effects of the dark current; 2) that high-voltage biasing during the patterning process must be avoided due to the electrolysis reaction; 3) lack of advantages from the frequency response of particles on AC field; and 4) inability to characterize particle electrically.

In summary, none of the previous efforts in this field disclose all of the benefits of the present invention, nor does the prior art teach or suggest all of the elements of the present invention.

III. Impedance Spectroscopy

Electrical impedance spectroscopy (EIS) is widely used in experimental studies to characterize living cell. For example, EIS can reflect the size, shape, and density of cells in tissue as well as the conductivity of intra and extra cellular milieu. This allows the identification of difference between tissues or between physiopatological states of the same tissue. The typical way to perform EIS on samples of tissue is the frequency sweep, with frequency range from several Hz to several MHz.

Single cell analysis using DEP and micro electrical impedance spectroscopy (u-EIS) was demonstrated on bovine chromaffin cells and red blood cells (Swomitra K, et al, "A Micro System Dielectrophoresis and Electrical Impedance Spectroscopy for Cell Manipulation and Analysis", TRANSDUCERS'03, pp 1055–1058, (2003)). A micro scale electrophysiological analysis system was fabricated by micromaching technologies and cells were injected into a microreservoir. Either a vacuum or DEP was utilize to move cells in the channel and position them between platinum electrodes for impedance analysis.

IV. MIS and EIS Tunnel Junction

The metal-insulator-semiconductor (MIS) structure has been proved to be extremely useful in semiconductor devices. When an ideal MIS structure is biased with positive or negative voltages, four cases may exist at the semiconductor. They are accumulation, depletion, inversion, and deep depletion cases. (S. M. Sze, "The Physics of Semiconductor Devices", $2^{nd}$ edition, Chapt. 7, pp362–370, Wiley Interscience (1981))

Let us use n-type semiconductor as an example. When a positive voltage is applied to the metal plate, the energy bands near the semiconductor surface are bent downward. According to semiconductor theory, the downward bending of the energy bands at the semiconductor surface gives rise to an enhanced concentration, an accumulation of electrons near the insulator-semiconductor interface. This is called the accumulation case.

When a small negative voltage is applied to the metal electrode of an ideal MIS structure, the energy bands bend upward. The majority carriers, electrons here, are pushed away from the surface by the electric field and depleted at the surface. This is called the depletion case. The surface region (layer), in which the majority carriers (electrons) are depleted, is called depletion region (layer). In the depletion case, the depletion layer will shield a significant amount of applied electric field.

According to the semiconductor theory, the hole concentration at the semiconductor surface is in proportion to the degree of the upward band bending. When a larger negative bias is applied, the bands bend upward even more and the hole concentration at the semiconductor surface may be larger than the intrinsic carrier concentration and the electron concentration at the surface becomes less than the intrinsic carrier concentration. The number of holes (minority carriers) at the surface is greater than the number of electrons (majority carriers); the surface is thus inverted. This is called the inversion case and there is an inversion layer at the insulator-semiconductor interface. As the band are bent further, eventually the hole concentration at the surface will be equal to or higher than the original electron concentration in the n-type semiconductor material. Typically, the width of the inversion layer ranges from 1 nm to 10 nm and is always much smaller than the surface depletion layer width. The inversion layer, after it is formed, will shield most of the applied electric field and work as a perfect electrode similar to a piece of metal.

In addition to the bias condition, the minority carrier concentration at the insulator-semiconductor interface also depends on the interaction between the supply capability of minority carriers and the leakage current through the insulator. Under the condition that the minority carrier concentration at the insulator-semiconductor interface is dominated by the leakage process, the minority carriers (holes for n-type semiconductor) will leak through the insulator and therefore the inversion layer can not be formed or maintained at the insulator-semiconductor interface. The semiconductor surface stays in the depletion region and this is called the deep depletion case.

When the thickness of the insulator layer is less than 5 nm, quantum tunneling phenomena plays significant role for a MIS structure. For a MIS tunnel junction formed on lightly doped semiconductor in the reverse bias region, the degree of inversion at semiconductor/ultra-thin insulating layer interface depends on the supply rate of minority carriers to the surface for a MIS tunnel junction (Green, M. A; Shewchun, J; Solid-State Electron, 17, pp. 349–365, (1974)). Under the condition without minority carrier injection, an inversion layer cannot be maintained at the interface due to the fact that minority carriers leak through ultra-thin insulating layer, due to the tunneling process. A significant portion of bias will drop in the depletion region in the semiconductor and the semiconductor is in the deep depletion region. With the help of external minority carries injection, such as illumination, an inversion layer can be built at the interface and will shield electrical field. As we know, the electron occupation can be characterized by an energy level, called the Fermi level, which will change along with applied bias. In the inversion case, bias will primarily drop on that ultra-thin insulating layer. As a result, the Fermi level in the metal electrode will move to majority energy band edge and a majority carrier tunnel current can be triggered. Theoretically, this process can result in the multiplication of any minority carrier current injected to the insulator-semiconductor interface by factors of 100–1000.

A localized multiplication process was also observed by this author in a prior study on a nano-size MIS tunnel junction formed by a STM tip on lightly doped silicon (Lin, Hai-An et al, Appl. Phys. Lett. Vol73 pp. 2462–2464, (1998)). In that case, the minority carriers were injected by illumination too and MIS tunnel diodes can work as a photo switch. It has been demonstrated that current multiplication can occur in a suitably biased MIS tunnel diode.

The characterization of electrolyte-insulator-semiconductor (EIS) junction is very similar to that MIS junction, except the metal in the MIS junction is replaced by an electrolyte in the EIS junction. One of well known EIS structures is the ion-sensitive-filed-transistor (ISFET). The ISFET is constructed by substituting a sensing film for the metal gate on the gate oxide of a traditional MOSFET and using electrolyte to apply the gate voltage. When the thickness of the insulator in an EIS junction is less than 5 nm, an EIS tunnel junction will be formed.

BRIEF SUMMARY OF THE INVENTION

The present invention comprises a "sandwich" electrochemical cell with an inversion layer electrode defined by the area of illumination region and an instrument to characterize the particles in the electrolyte. The electrode is formed by an inversion layer maintained by a proper bias and illumination. With this novel tool, it is possible to perform biochemical analysis in an integrated semiconductor chip. In addition, the optoelectronic probe can also be a powerful tool to assemble next generation nano-electronic or optoelectronic devices. Basically, this device has the ability to trap, move, deform, merge, separate and characterize particles, such as cells, molecules, any type of colloids, any of inorganic and bio-organic substances, beads, as well as pucks and like small things on a semiconductor chip.

The first advantage for the present invention is that the size of the electrode is self-defined by the size of light beam. It will be easy to adjust the electrode size to match a single cell by simply adjusting beam size. Therefore we are able to characterize a single cell in a convenient way. On the other hand, a large beam size can also be used to assemble a particle array. This is very different from the Optical Tweezer where the trapping zone is too small (on the order of the light wavelength) to manipulate the particle array.

The second advantage for the present invention is that an inversion region is used as a working electrode. The inversion layer has behavior similar to a metal electrode. The most of applied electric field can be shielded by the inversion layer and no significant field will penetrate into the semiconductor bulk. In addition, a majority carrier tunneling process will also reduce voltage drop on the oxide layer. Therefore a significant portion of bias will be dropped into the electrolyte. Furthermore, the metal-like electrode formed by the inversion layer is also perfect for the impedance characterization. This is very different from the conventional illumination-assisted field induced assembly technologies (or a conventional optoelectronic tweezers), where the semiconductor bulk or depletion region plays as the electrode. The involvement of the depletion region at the semiconductor surface will cause an extreme complexity on the voltage distribution among the different part of the "sandwich" electrochemical cell and make it very difficulty to analyze the impedance spectroscopy.

The third advantage for the present invention comes from a thin oxide layer formed on the silicon surface. This oxide layer will reduce the dark current significantly and a well defined electrode can be successfully formed.

The fourth advantage for the present invention comes from combination of time constant electric field and time-varying electric field. The combined use of time constant electric field and time-varying electric field can complement the limitations of EP and DEP, and potentially provide an integrated method for manipulation of bioparticles and macromolecules on microfabricated chips.

The fifth advantage for the present invention also comes from combination of time constant electric field and time-varying electric field. The combined use of time constant electric field and time-varying electric field avoids using high DC voltage to generate high electric field in order to manipulate small particles. Therefore a strong electrolysis reaction under high DC current is not going to happen.

Finally, in the conventional illumination-assisted field induced assembly technologies (or a conventional optoelectronic tweezers), the illumination modulates the photoconductivity of semiconductor. The illumination in the present invention, however, is only utilized to compensate the leaking minority carrier current. Therefore, in present invention, one has extreme flexibility to choose the optical sources and can avoid the biological object integrity problem caused by focus beam with very high intensities.

DETAILED DESCRIPTION OF THE INVENTION

The following description is of the best mode presently contemplated for the carrying out of the invention. This description is made for the purpose of illustrating the general principles of the invention, and is not to be taken in a limiting sense. The scope of the invention is best determined by reference to the appended claims.

I. Optoelectronic Probe

Figure 1:
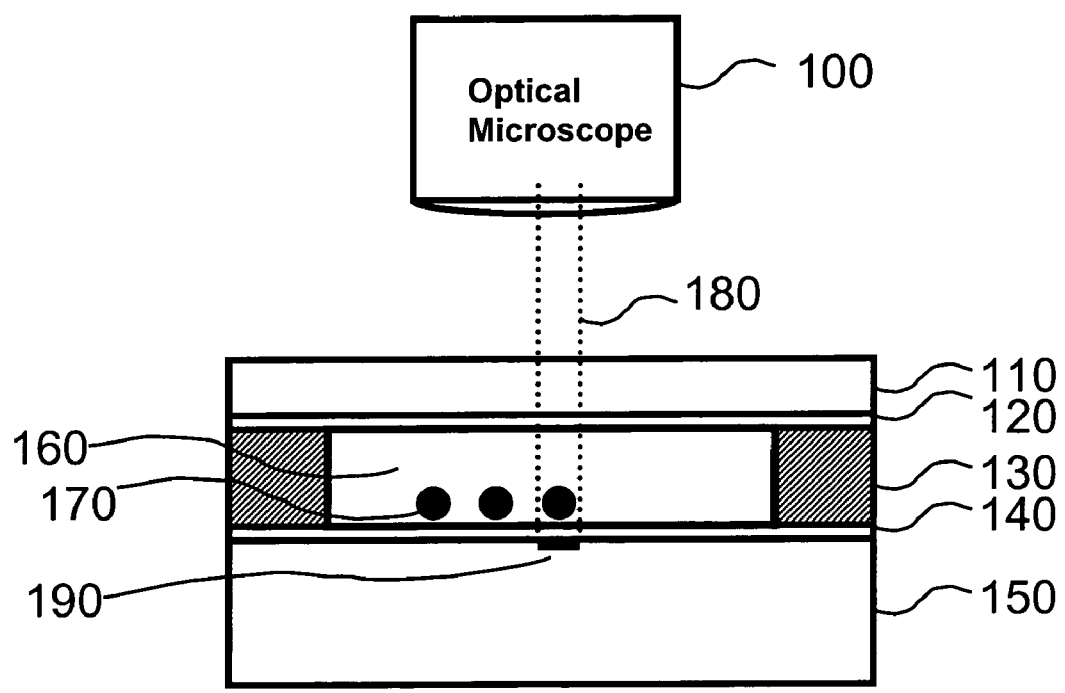
FIG. 1 is a sectional view of an embodiment of the optoelectronic probe.

FIG. 1 is a sectional view of an embodiment of the present invention. An optical microscope, represented by reference number 100, can be used to observe and record the particle manipulation process. The top electrode of the "sandwich" electrochemical cell is formed by a glass slide 110 coated by an optically transparent conducting thin film, such as indium tin oxide (ITO) 120. This kind of transparent conducting electrode is commercially available. A spacer (typically thick ~50 μm), represented by reference number 130, is formed by polymer film with a hole in the center. Reference numeral 140 denotes a layer of thin oxide (typically about 15–30 Angstroms thick) and reference numeral 150 denotes a piece of n-type silicon, with doping density range from $10^{16}$–$10^{17}$ cm$^{-3}$. The properly doped n-type silicon, covered with a thin oxide layer, is used to form the bottom electrode, where an Electrolyte/Insulator/Semiconductor (EIS) structure will perform a Metal-Insulator-Semiconductor-like, or MIS-like tunnel diode. Reference numeral 160 denotes the electrolyte. The bottom electrode will also work as a stage to support particles, which are represented by reference number 170. Contact to electrodes is achieved through leads in the form of Au wires by means of silver epoxy. Reference numeral 180 denotes a light beam from the illumination source and reference numeral 190 denotes an inversion region, which works as a working electrode to control the movement of particles in the electrolyte. A laser beam, such as a 633 nm He—Ne laser, or IR laser diode, range from 650 to 680 nm, can be used here as a illumination source to inject minority carriers. The laser beam is steered by a pair of orthogonally scanning galvanometer mirrors as described in a paper by P. Y. Chiou et al. range (Chiou, P. Y; Chang, Z; et al; Proc. IEEE/LEOS International Conference Optical MEMS, pp. 8–9, (2003)). The beam is sent through a microscope and the objective lens is used to both focus the beam and view the trapped object. For assembling a particle array, a regular microscope illuminator can also be used here, with apertures or masks to provide the required shape or size of beam (Seul, M et al, U.S. Pat. No. 6,251,691 (1997)). In addition, a CCD camera is used to monitor the trapped objects.

The silicon surfaces are carefully cleaned in adherence with semiconductor industry standard RCA and Piranha cleaning protocols. The original "native" oxide can be removed by HF solution. The thin oxide, represented by reference number 140 as shown in FIG. 1, can be thermally grown under standard conditions in a furnace at 950 degrees C. In addition, the thin oxide layers can also be regrown after removal of the original "native" oxide in HF solution, under UV illumination from a deuterium source in the presence of oxygen. The back side oxide is stripped away, using conventional oxide stripping process. In order to have better performance, silicon 150 in the FIG. 1 can be replaced by a piece of epitaxial silicon. The n$^-$ ($\rho$~15–20 $\Omega$-cm) epi layer about 6–8 µm will make sure a depletion layer at the silicon surface and 200–250 µm thick n$^+$ ($\rho$~0.01 $\Omega$-cm) substrate is used to reduce the serial resistance. All kinds of silicon wafers are commercially available throughout the semiconductor industry.

II. Electric Input

Figure 2A:
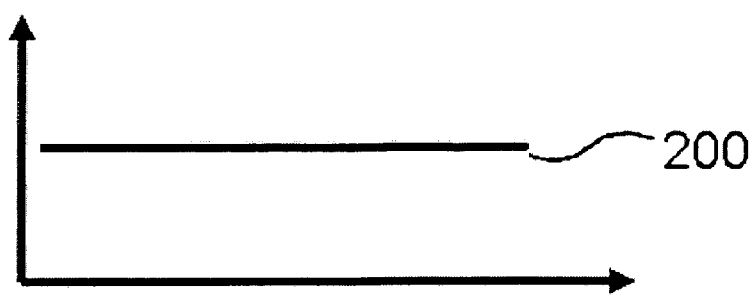
FIG. 2A is the wave function of the time constant voltage.
Figure 2B:
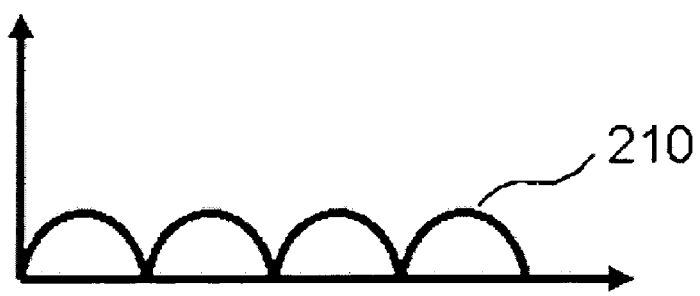
FIG. 2B is the wave function of the DC time-varying voltage.

A positive time constant bias is denoted by reference number 200 in FIG. 2A. A time-varying voltage with chosen frequency is denoted by reference number 210 in FIG. 2B. In order to make sure semiconductor surface stay either in the depletion region or strong inversion region, we are using a DC time-varying voltage signal here, as shown in FIG. 2B. The DC time-varying voltage 210 will superpose to the positive time constant bias 200. The final applied input is denoted by reference number 220, as shown in FIG. 2C.

Figure 2C:
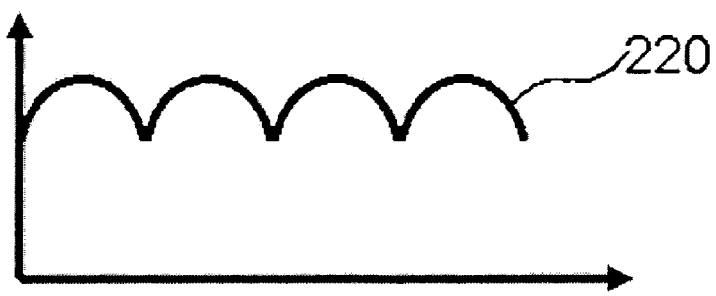
FIG. 2C is the wave function of the combination of the time constant voltage and DC time-varying voltage.
Figure 3:
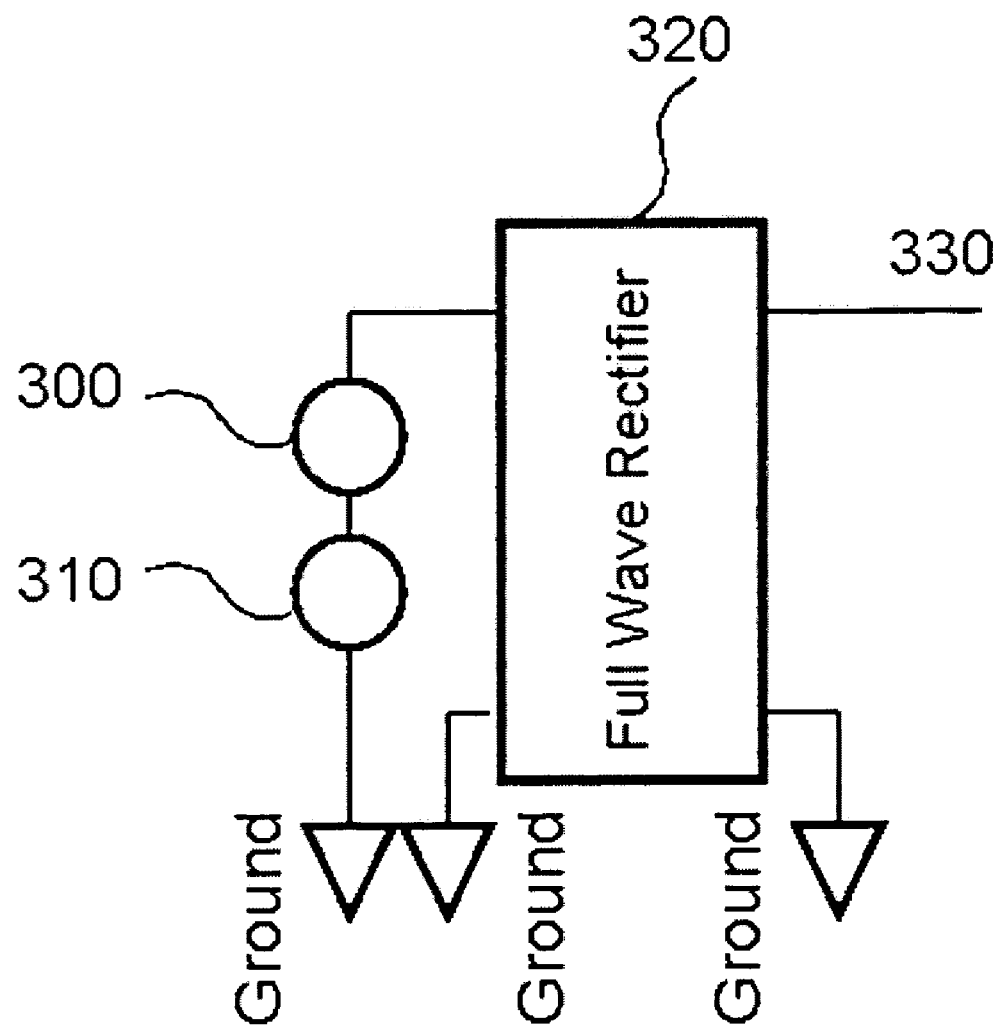
FIG. 3 schematically illustrates an embodiment of electric input, which has the wave function as shown in FIG. 2C.

FIG. 3 schematically illustrates an embodiment of electric input 220 shown in FIG. 2C. The time constant voltages are generated by a commercially available voltage source 300, with applied bias adjustable. The time-varying voltages are produced by a function generator 310, with frequencies varying from DC to several MHz. A commercially available full wave rectifier 320 is used to rectify the AC input signal from the function generator into a DC time varying voltage signal. The positive time constant voltages, superposed by the DC time-varying voltages, are applied to the silicon piece through terminal 330. In this way, the n-type silicon electrode will always stay in the positive bias region. Due to current leakage via tunneling between the red-ox level $E_{redox}$ in the electrolyte and the valence band of the silicon, the thin oxide/silicon interface will be set into deep depletion region by the applied bias and the depletion layer at the semiconductor surface will shield most of the external electrical field. It is just like a switch being turned off and no significant electrical field is able to penetrate into the electrolyte.

III. Inversion Layer Electrode

Figure 4A:
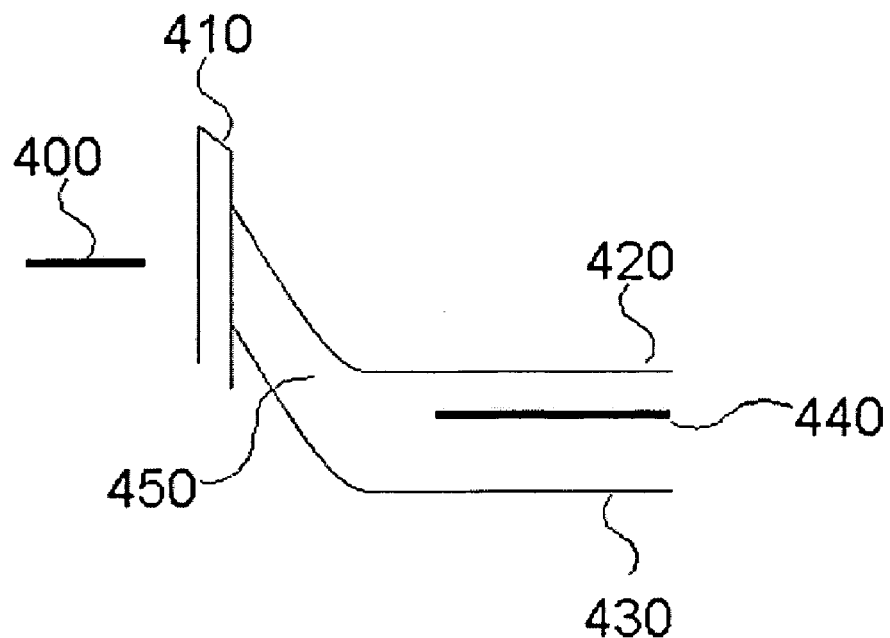
FIG. 4A is the energy band diagram for the deep depletion situation for the EIS Junction.

The energy band diagram for the deep depletion situation is shown in FIG. 4A. The red-ox level $E_{redox}$ is represented by reference number 400. The potential barrier formed by ultra-thin oxide is denoted by reference number 410. Reference number 420 represents the conduction band edge, reference number 430 represents the valence band edge and reference number 440 represents the silicon Fermi level. The reference number 450 represents the depletion region at the silicon surface. In order to simply the discussion, here we ignore the space charge region in the electrolyte.

Figure 4B:
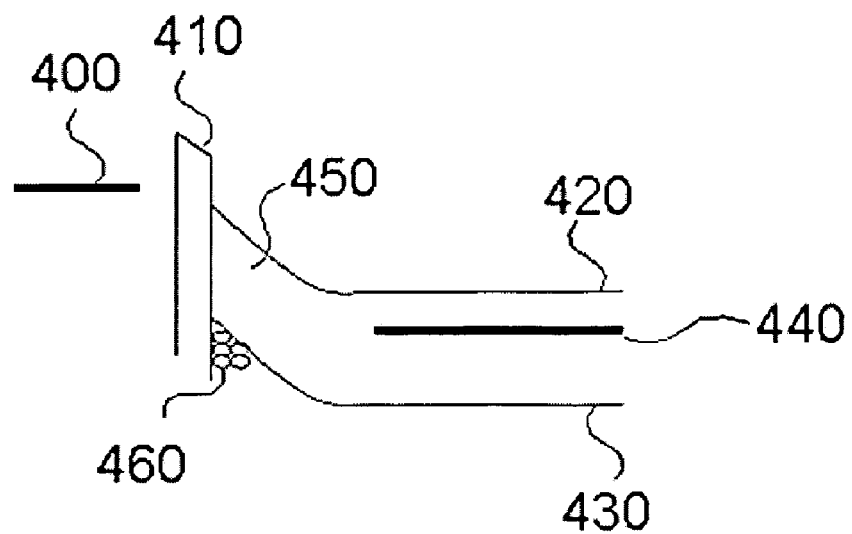
FIG. 4B is the energy band diagram for the inversion situation for the EIS junction.
Figure 5:
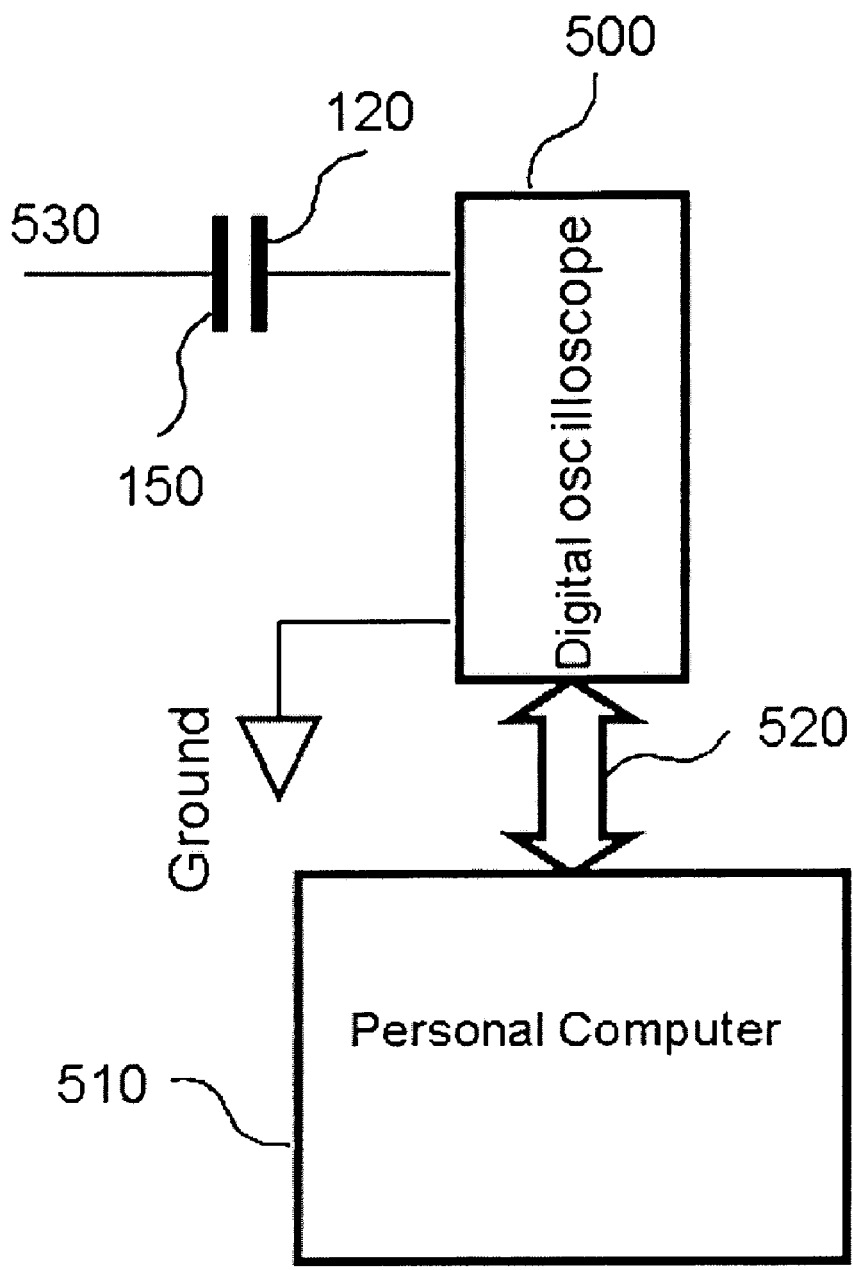
FIG. 5 schematically illustrates an embodiment of an impedance analyzer for characterizing the trapped particles.

If a beam of light injects into the surface of deep depleted EIS tunnel diode, extra holes, which are the minority carrier herein, will be supplied to the silicon surface to compensate the leaked holes. The semiconductor surface in the illumination area will be turned into inversion. The holes, denoted by the reference number 460 in FIG. 4B, accumulate at the surface and work as an electrode to shield the electrical field, as denoted by the reference number 190 in FIG. 1. Furthermore, the red-ox level 400 in the electrolyte will be moved up above the semiconductor conduction band 420, as shown in FIG. 4B and, a majority carrier current can be carried by direct tunneling process between the red-ox level and conduction band. Therefore, a significant bias will be dropped in the electrolyte in the illuminated area. Outside the illuminated area, the semiconductor still stay in the deep depletion and the electric field is shielded by the depletion layer. Since the inversion layer electrode 190 has area much smaller than that of ITO film 120, as shown in FIG. 1, an electric field concentration region has been well defined by the illuminated area and a non-uniform electric field has been built into the electrolyte between the top electrode 120 and the bottom electrode 190 formed by the inversion layer.

IV. Basic Operations

The non-uniform electric field can be used to trap charged particles by EP process or polarized (charged or neutral) particles by DEP process. An array of particles can be assembled in a designed area, and the interparticle spacing and internal state of order within the array may be controlled by adjusting the applied field prior to anchoring the array to the substrate.

An array of particles starts with a capture process. As long as the inversion layer electrode is formed, particles will be captured over it. An array starts to grow and will continue to grow until it approaches the outer limits of the electrode. The internal state of order of captured aggregate of particles is determined by the strength of applied voltage, high values favoring increasingly denser pacing of particles and the eventual formation of ordered arrays displaying a hexagonally crystalline configuration in the form of a bubble raft. The size and shape of the array are determined by the light beam. Arrays are maintained by the applied electric field in a liquid environment. Removal of the applied voltage results in the disassembly of the array.

The process also leaves the array in a state that may be readily subjected to further chemical modification such as cross-linking, or made permanent by chemical anchoring to the substrate. This is best accomplished by involving anchoring chemistries analogous to those relying on heterbifunctional cross-linking agents invoked to anchor proteins via amide bond formation. Molecular recognition, for example between biotinylated particles and surface-anchored streptavidin, provides another class of coupling chemistries for permanent anchoring.

If the light beam moves from one position to the next position, the inversion layer electrode will move along with the beam and so will the trapped particle array, as long as the light beam has a moving speed slower than that of particles, dragged by the lateral component of the non-uniform electric field. The control of lateral particle transport by changing or moving patterns of illumination has the advantage that it may be applied whenever and wherever required.

V. Time Constant Fields

Under the condition that only a time constant voltage is used, the polarity of the dielectrophoretic force on the particle depends on the conductivity difference between the particles and electrolyte. If the particle is more conductive than the electrolyte around it, the dipole aligns with the field and the force acts up the field gradient towards the region of highest electric field. Examples of trapping polarized (charged or neutral) particles by DEP process can be demonstrated by colloidal beads, such as silica, and polystyrene, with a diameter in the range from several hundred Angstroms to 2 μm. With silica, the electrolyte is triply distilled water (pH=5.8 with a conductivity of <1 μS cm$^{-1}$); for polystyrene the suspending electrolyte contained a mixture of ionic and nonionic surfactants added to provide the colloidal stability. At proper electric field range (<100 V cm$^{-1}$ typically), the particle trapping process is reversible. When the field is removed, the particle array is stirred by Brownian motion. On the other hand, a strong electric field compresses the particles and they coagulate or adhere to the electrode surface. The array will be assembled and permanently frozen on the electrode surface. With properly adjusting the size of illumination (focused laser beam), we can have a reasonable size of electrode and therefore all the operations mentioned above can be repeated on a single particle, or a single living cell.

VI. Combination of Time Constant/Time-Varying Fields

When a time-varying voltage is superposed to the applied time constant voltage, the combination of the time-varying and time constant electric field will bring us extreme flexibility to manipulate particles. This is because that the dielectrophoretic force on the particle will vary with the frequency of the applied electric field. If the particle is less polarisable than the electrolyte, the dipole aligns against the field and the particle is repelled from regions of high electric field. This effect is called negative dielectrophoresis (NDEP). Particles having different dielectric properties will experience different DEP forces that may be exploited for particle selective manipulation. Therefore, the frequency of the time-varying voltage can be chosen to selectively trap or deform particles if they are deformable particles, such as living cells.

This example will show how we can separate spores to bacteria. Sample preparation process is similar to one described in a paper by Y. Huang et al. (Huang, Y; Ewalt, K. L; et al; "Electric Manipulation of Bioparticles and Macromolecules on Microfabricated electrodes", Anal Chem, 73, pp. 1549–1559, (2001)). *B. globigii* spores (the Biological Defense Research Directorate, Bethesda, Md.) were stocked in phosphate-buffered saline (PBS, pH=7.2; Life Technologies, Grand Island, N.Y.) at a concentration of $1.4\times10^9$ spores/mL. Heat-killed *E. coli* O157:H7 bacteria (KPL, Gaithersburg, Md.) were stocked in distilled water at a concentration of $7\times10^9$ bacteria/mL. Heat-killed *E. coli* bacteria and *B. globigii* spores were washed 3 times in 280 mM mannitol (Sigma) nd resuspended in the mannitol solution having a conductivity of 20 μS/cm. The final mixture concentration was $2\times10^8$/mL and $3\times10^8$ mL for bacteria and spores, respectively. The time-varying voltage here used has frequency about 50 KHz. The bacteria were repelled from the inversion layer electrode by NDEP force and the spores were trapped over the electrode by DEP force. If the light beam moves from one position to the next position, the trapped spores will moves along with the beam. Therefore, the spores will be separated further from the bacteria.

The negative DEP force also gives us another way to transport particles in the electrolyte on the semiconductor surface. A 100 KHz time-varying voltage is applied in this case to drive 20 μcm polystyrene particles (from Polysciences). The buffer solution consists of deionized water and KCL, mixed to have a conductivity of 10 mS/m. The particle is pushed by the optical beam, until at sufficiently high scan rate.

VII. Impedance Spectroscopy

Conventional impedance-based sensing of particles is a well-accepted method for the counting, sizing and characterizing of particles and cells and finds wide application in clinical and veterinary laboratories for the analysis of blood, cell suspensions, and other samples. In general, the particle response is frequency dependent and the frequency dependency can be used to characterize or identify the particle. Applications of the present invention are vast and include, but are not limited to applications such as cell and particle counting, cell and particle subpopulation analysis, cell viability analysis, cell and particle concentration analysis, cell differential analysis, medical applications, veterinary applications, bioengineering, food analysis, soil analysis, in-line particle detection in fluidic circuits and systems, detection of bacterial spores and other biological agents of potential use in warfare and terrorism, discrimination of potentially harmful biological agents from non harmful biological cells such as pollen and from inert particulate materials such as dust, smoke, and non-viable cells, detection of responses of cells such as human blood cell subpopulations to biological and chemical agents, and detection and discrimination of bacterial cells and spores (including anthrax) for medical, agricultural, environmental, and biowarfare and bio-terrorism detection applications.

FIG. 5 schematically illustrates an embodiment of an impedance analyzer for characterizing the trapped particles in the field concentration region on the bottom silicon electrode 150 of FIG. 1. As shown in the FIG. 5, an impedance analyzer consists of a digital oscilloscope 500 to sense the current signal and a personal computer 510 to analyze the current signal and generate the impedance spectroscopy. The data bus 520 is responsible for the communication between the digital oscilloscope 500 and personal computer 510. The input of the digital oscilloscope 500 is connected to top ITO electrode 120 of FIG. 1 to collect the current signal. The terminal 530, which in one side is contact to the bottom silicon electrode 150 of FIG. 1, is connected to terminal 330 in FIG. 3. The out put of the rectifier 490 in FIG. 3 gives us the desired voltage signal as shown in FIG. 2C. An array of particles can be characterized by the impedance analyzed after it is assembled. A classical method to perform impedance measurements on particles is the frequency sweep, with the frequency range of the time variable electrical field 310 in FIG. 3 from several Hz to several MHz. The responses of particles on applied electric fields are sensed by the digital oscilloscope 500 and analyzed by the personal computer 510. Both the magnitude and phase measurements of the impedance have interesting implications, in regards to particle characterization and identification.

In the case that a single cell is trapped by the optoelectronic probe, we are able to characterize the single cell by the impedance analyzer. Since the inversion layer electrode is defined by the illumination, it will be easy to make it match the cell size by simply adjusting beam size. In addition, the inversion layer will shield most of the applied electric field and work as a perfect electrode similar to a metal piece. This is very different from the conventional illumination-assisted field induced assembly technologies (or a conventional optoelectronic tweezers), where the semiconductor bulk, or depletion region plays as the electrode. The involvement of the depletion region at the semiconductor surface will cause an extreme complexity on the voltage distribution among the different part of the "sandwich" electrochemical cell and make it very difficulty to analysis the impedance spectroscopy. All those features in the present invention will give us an edge to sense the single cell.

CONCLUSION

All of the methods disclosed and claimed herein can be made and executed without undue experimentation in light of the present disclosure. While the techniques of this invention have been described in terms of specific embodiments, it will be apparent to those of skill in the art that variations may be applied to the methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

What is claimed is:

1. A method for controlling the movement of particles in an electrolyte, comprising the following steps:
   providing a semiconductor material;
   forming an insulating layer over said semiconductor material;
   attaching an electrolyte solution to said insulating layer;
   applying an electric input to said semiconductor material, said electric input having a predetermined polarity;
   illuminating the surface of said semiconductor material with a predetermined light beam;
   maintaining an inversion region at the interface between said semiconductor material and said insulating layer, said inversion region being defined by said predetermined light beam, said inversion region working as an electrode; and
   providing a plurality of particles suspended in said electrolyte solution, said particles being manipulated by said electrode, in accordance with said electric input and said predetermined light beam.

2. The method of claim 1, further comprising a characterizing step which is performed using an instrument to measure the electric response of said particles on said electric input.

3. The method of claim 2, wherein said instrument is an impedance analyzer.

4. The method of claim 1, wherein said semiconductor material has a predetermined doping density to form a depletion layer at the interface between said semiconductor material and said insulating layer.

5. The method of claim 1, wherein said insulating layer has a predetermined thickness to enable to tunnel carriers between said electrolyte and said semiconductor material.

6. The method of claim 1, wherein said electric input is a voltage input that comprises both a time constant component and a time-varying component.

7. The method of claim 6, wherein said time-varying component has a frequency to polarize said particles.

8. The method of claim 7, further comprising the step of sweeping said frequency from a first predetermined value to a second predetermined value.

9. The method of claim 6, wherein said time-varying component is a direct current time-varying component which has the same polarity as said time constant component.

10. The method of claim 1, further comprising the step of assembling an array of said particles over said electrode, in accordance with said electric input and said predetermined light beam.

11. The method of claim 10, further comprising the step of maintaining said array by either maintaining said predetermined light beam and said electric input, chemically linking said particles, or confining said particles.

12. The method of claim 10, further comprising the step of disassembling said arrays by removing said electric input, or turning off said predetermined light beam.

13. The method of claim 10, further comprising the step of moving said array by steering said predetermined light beam.

14. The method of claim 10, wherein said predetermined light beam is adjusted to reconfigure said particle array in accordance with said predetermined light beam.

15. A method for probing particles in an electrolyte using a semiconductor material covered with an insulating layer, comprising:
    applying an electric input to said semiconductor material;
    illuminating the surface of said semiconductor material with a predetermined light beam to form an inversion region at the interface between said insulating layer and said semiconductor, said inversion region working as an electrode;
    trapping a particle over said electrode in accordance with said electric input; and
    analyzing the electric response of said particle on said electric input.

16. A method for characterizing particles in an electrolyte using photosensitive material, comprising:
    applying an electric input on said photosensitive material;
    illuminating the surface of said photosensitive material with a predetermined light beam in conjunction with said electrical input to generate an electrode to control the movement of said particles; and
    analyzing the electric response of said particles on said electric input.

17. An apparatus for probing particles in an electrolyte, comprising:
    a semiconductor material;
    an insulating layer formed over said semiconductor material;
    an electrolyte solution attached to said insulating layer;
    an electric source which applies an electric input to said semiconductor material, said electric input having a predetermined polarity;
    a predetermined light beam which illuminates the surface of said semiconductor material to maintain an inversion region at the interface between said insulating layer and said semiconductor, said inversion region working as an electrode;
    a plurality of particles suspended in said electrolyte solution, said particles being manipulated by said electrode in accordance with said electric input; and
    an instrument for measuring the electric response of said particles on said electric input.

* * * * *